(12) United States Patent
Luo (10) Patent No.: US 9,739,800 B2
(45) Date of Patent: Aug. 22, 2017

(54) CLAMP METER AND CLAMP PROBE

(71) Applicant: Fluke Corporation, Everett, WA (US)

(72) Inventor: Shounan Luo, Shanghai (CN)

(73) Assignee: Fluke Corporation, Everett, WA (US)

( * ) Notice: Subject to any disclaimer, the term of this patent is extended or adjusted under 35 U.S.C. 154(b) by 1 day.

(21) Appl. No.: 14/861,902

(22) Filed: Sep. 22, 2015

(65) Prior Publication Data

US 2016/0084879 A1    Mar. 24, 2016

(30) Foreign Application Priority Data

Sep. 24, 2014  (CN) .......................... 2014 1 0491442

(51) Int. Cl.
*G01R 1/04* (2006.01)
*G01R 15/18* (2006.01)
(Continued)

(52) U.S. Cl.
CPC ....... *G01R 1/0416* (2013.01); *G01R 1/06788* (2013.01); *G01R 1/22* (2013.01);
(Continued)

(58) Field of Classification Search
CPC combination set(s) only.
See application file for complete search history.

(56) References Cited

U.S. PATENT DOCUMENTS

| 5,899,947 A | 5/1999 | Hall et al. | |
| 6,570,373 B1 * | 5/2003 | Viola | G01R 35/005 324/117 H |

(Continued)

FOREIGN PATENT DOCUMENTS

| CN | 2465192 Y | 12/2001 |
| CN | 1493886 A | 5/2004 |

(Continued)

OTHER PUBLICATIONS

First Office Action, State Intellectual Property Office of the People's Republic of China, mailed Sep. 26, 2016, for Chinese Application No. 201210335068.6, 19 pages (English Translation).

(Continued)

*Primary Examiner* — Clayton E LaBalle
*Assistant Examiner* — Jas Sanghera
(74) *Attorney, Agent, or Firm* — Seep IP Law Group LLP (57) ABSTRACT

The present application relates to a clamp meter and a clamp probe that can be matched for use with the clamp meter. The clamp meter comprises a main meter body having an interfacing connector and one or more clamp probes, wherein each of the clamp probes is detachably connectable to the interfacing connector of the main meter body. Each of the clamp probes has a converting unit that converts a signal measured by the clamp probe to an output measurement signal within a predetermined measurement range of the main meter body, and each of the clamp probes has an identity indicator readable by the main meter body. As the clamp meter according to the present application can be matched with a plurality of clamp probes having different measurement ranges, a user only needs to purchase one main meter body and one or more clamp probes of different models to meet various measuring needs. This can enhance the flexibility and extendibility of the usage of a clamp meter, as well as reduce the user's financial burden.

28 Claims, 4 Drawing Sheets

(51) Int. Cl.
  *G01R 1/067*   (2006.01)
  *G01R 1/22*    (2006.01)
  *G01R 15/08*   (2006.01)

(52) U.S. Cl.
  CPC .............. *G01R 15/18* (2013.01); *G01R 15/08* (2013.01); *G01R 15/186* (2013.01)

(56) References Cited

U.S. PATENT DOCUMENTS

| | | | |
|---|---|---|---|
| 7,990,155 | B2 | 8/2011 | Henningson |
| 2004/0051533 | A1 | 3/2004 | Namaky |
| 2005/0162172 | A1 | 7/2005 | Bertness |
| 2005/0209810 | A1 | 9/2005 | Piaud et al. |
| 2007/0013507 | A1 | 1/2007 | Sparacino |
| 2007/0063689 | A1* | 3/2007 | Baker .................. G01R 15/202 324/76.11 |
| 2007/0252578 | A1* | 11/2007 | Luo .................... G01R 1/06788 324/126 |
| 2008/0284410 | A1 | 11/2008 | Perez |
| 2009/0174562 | A1 | 7/2009 | Jacobus et al. |
| 2011/0001960 | A1 | 1/2011 | Van Heugten |
| 2011/0074390 | A1* | 3/2011 | Bartlett .............. G01R 1/06766 324/76.41 |
| 2012/0169324 | A1 | 7/2012 | Worones |

FOREIGN PATENT DOCUMENTS

| | | | |
|---|---|---|---|
| CN | 102087339 A | 6/2011 | |
| CN | 102540094 A | 7/2012 | |
| CN | 202929052 U | 5/2013 | |
| DE | 33 35 227 A1 | 4/1985 | |
| EP | 0 786 647 A1 | 7/1997 | |
| EP | 0786647 A1 * | 7/1997 | .............. G01D 3/02 |
| EP | 1 801 699 A2 | 6/2007 | |
| EP | 1801699 A2 * | 6/2007 | ......... G01R 1/06788 |
| EP | 2 693 224 A1 | 2/2014 | |
| WO | 96/10189 A1 | 4/1996 | |
| WO | 2009/097400 A1 | 8/2009 | |
| WO | 2012/112924 A1 | 8/2012 | |

OTHER PUBLICATIONS

Extended European Search Report, dated Aug. 5, 2016 for European Application No. 15186526.8, 14 pages.

* cited by examiner

CLAMP METER AND CLAMP PROBE

BACKGROUND

Technical Field

The present application relates to an electrical measuring device, and particularly, to a clamp meter for measuring current, and a clamp probe that can be matched for use with the clamp meter.

Description of the Related Art

In the electronic industry, measuring devices are often used to measure the current flowing through a current-carrying conductor. Various current-measuring methods have been developed in this field. For example, current can be measured via connecting a multiple-meter and a cable in series. In addition, those skilled in the art also developed a clamp meter for measuring current by determining the magnetic field around a current-carrying conductor. However, all existing clamp meters in the market are designed for a specific measurement range and a specific application field. Depending on the different measurement ranges and application fields of a clamp meter, the structure of a clamp of the clamp meter (such as the shape and size of the clamp) and its physical parameters need to be modified accordingly, and the measuring circuit inside the clamp meter also needs corresponding adaption. Currently, a clamp meter of a particular design can only measure a current falling into its measurement range. In order to measure current of different ranges, such as 4-20 mA, 0-40 A, 0-400 A, 0-1000 A, 0-2000 A, etc., a user needs to have a set of clamp meters of different models that are compatible with the ranges to be measured, which on the one hand will increase a user's financial burden and on the other hand can cause complex operative and error-prone situations due to replacement of clamp meters of different models.

BRIEF SUMMARY

Directed to the above defects in the prior art, according to one aspect of the present application, a clamp meter is provided. The clamp meter includes a main meter body having an interfacing connector; and one or more clamp probes, wherein each of the clamp probes is detachably connectable to the interfacing connector of the main meter body, and wherein each of the clamp probes has a converting unit that converts a signal measured by the clamp probe to an output measurement signal within a predetermined measurement range of the main meter body, and each of the clamp probes has an identity indicator readable by the main meter body.

According to another aspect of the present application, the clamp meter includes a plurality of clamp probes, each of which is capable of being connected to the interfacing connector of the main meter body.

According to another aspect of the present application, the clamp probes are configured for measuring currents having different ranges.

According to another aspect of the present application, each of the clamp probes has a memory readable by the main meter body. The memory of each clamp probe stores the identity indicator of the clamp probe. The memory of each clamp probe stores a conversion function or diagram of the clamp probe.

According to another aspect of the present application, the identity indicator is in the form of a series number, a tag having a specific bar code thereon, a radio frequency identification tag, or a near field communication tag.

According to another aspect of the present application, the main meter body further includes a wireless communication unit for transmitting measurement data according to the output measurement signal to a receiving system or receiving an instruction signal and input information from the receiving system.

According to another aspect of the present application, the main meter body provides power to a clamp probe connected to the main meter body.

According to another aspect of the present application, each clamp probe has a clamp and an adapting connector and further includes a cable electrically connecting the clamp and the adapting connector. The adapting connector is capable of electrically connecting to the interfacing connector of the main meter body.

According to another aspect of the present application, one of the adapting connector and the interfacing connector is configured as a socket, and the other is configured as a plug.

According to another aspect of the present application, the converting unit of the clamp probe is placed in the adapting connector.

According to another aspect of the present application, the identity indicator of each clamp probe may contain information regarding a conversion function or diagram of the clamp probe and also information regarding the measurement range of the clamp probe.

According to another aspect of the present application, the main meter body is configured to display the measurement range of a clamp probe connected to the main meter body.

According to another aspect of the present application, the main meter body carries a battery.

According to another aspect of the present application, a clamp probe is provided. The clamp probe includes a converting unit that converts a signal measured by the clamp probe to an output measurement signal within a predetermined measurement range; and an identity indicator indicating information of the clamp probe.

As the main meter body of the clamp meter according to the present application can be matched with a plurality of clamp probes having different measurement ranges, a user only needs to purchase one main meter body and the clamp probes of the corresponding models to meet various measuring needs. This can enhance the flexibility and scalability of the usage of a clamp meter, as well as reduce the user's financial burden.

BRIEF DESCRIPTION OF THE DRAWINGS

The aforementioned features and other features of the application will be further described by reference to the accompanying drawings and the appended claims. It will be understood that, these accompanying drawings merely illustrate certain embodiments of the present application and should not be considered as limitation to the scope of the present application. Unless specifically stated, the accompanying drawings are not necessarily made to scale, and similar marks usually illustrate similar components.

DETAILED DESCRIPTION

The following detailed description refers to the accompanying drawings, which form a part of the present application. The illustrative embodiments described in the detailed description, the accompanying drawings and the claims are not meant to be limiting, and other embodiments may be adopted, and modifications may be made, without departing from the spirit or scope of the subject matter presented herein. It should be readily understood that, the various aspects of the application, as described herein, and illustrated in the drawings, can be arranged, substituted, combined, separated, and designed in a wide variety of different configurations, all of which are implicitly contemplated in the application.

For the purpose of clear description, some specific terms will be applied herein to clearly describe the specific embodiments. However, the terms are not intended to limit the protection scope of the present application. Instead, these terms shall be understood broadly to cover any and all equivalents achieving similar objectives by applying similar means.

Figure 1:
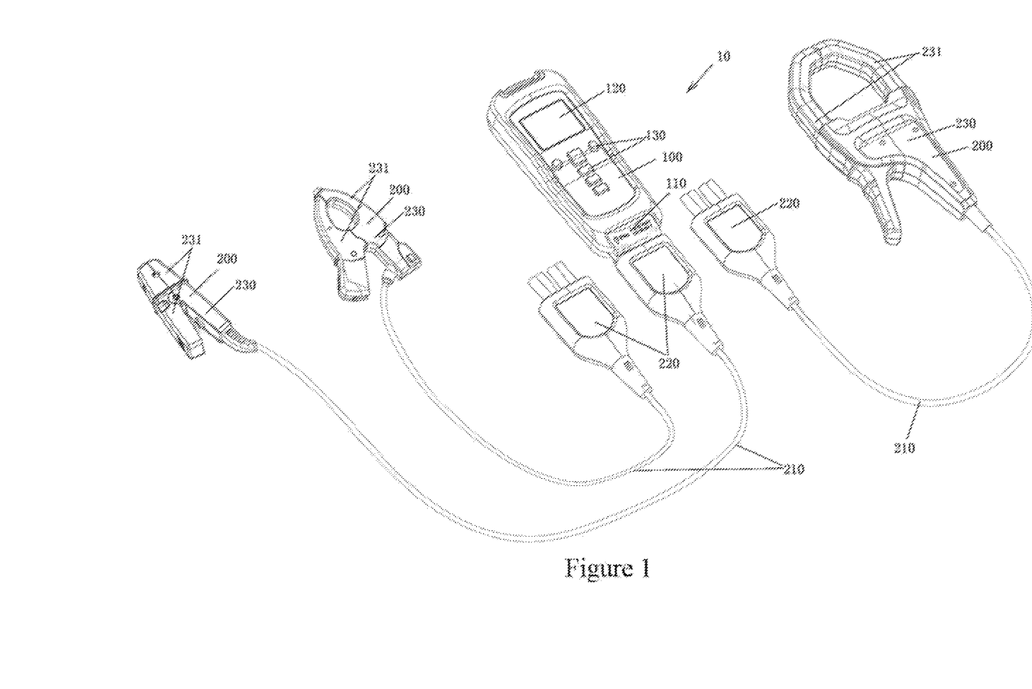
FIG. 1 depicts a structure diagram of a clamp meter according to an embodiment of the present application.
Figure 2:
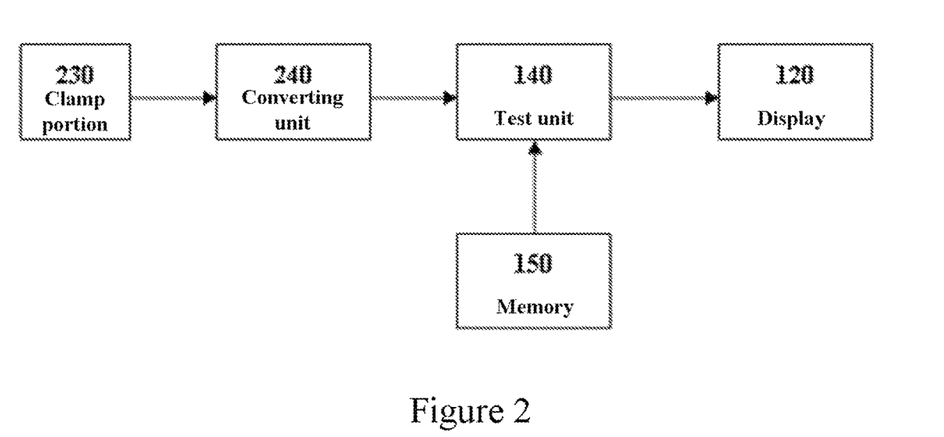
FIG. 2 depicts a block diagram indicating the signal transmitting relationship between the functional units of the clamp meter shown in FIG. 1.

First we will refer to FIGS. 1 and 2 to describe a clamp meter 10 according to an embodiment of the present application. As shown in FIG. 1, the clamp meter 10 includes a main meter body 100 and a plurality of clamp probes 200. The main meter body 100 has an interfacing connector 110, and each of the clamp probes 200 is separately detachably connectable to the interfacing connector 110 of the main meter body 100. The main meter body 100 further includes a display 120 for displaying measuring results and other related information, and an input device 130 for inputting information such as measuring instructions and the like. In the present application, the display 120 can be a display of any suitable type such as a liquid crystal display (LCD), a light-emitting diode (LED), an organic light-emitting diode (OLED), a plasma display panel (PDP) or an E-INK display. In the embodiment shown in FIG. 1, the input device 130 is configured as a plurality of buttons. However, the clamp meter 10 of the present application can also use any other suitable physical or virtual input device such as a knob, a touch screen, a writing pad, etc.

In addition, the main meter body 100 can also carry a power supply (such as a battery or a battery pack) for supplying power to the functional units of the main meter body 100 and the clamp probes 200. The main meter body 100 also includes a detection unit 140 for measuring the current flowing through a current-carrying conductor according to the signal input by the clamp probes 200 and other input information. In certain embodiments, the main meter body 100 also includes a wireless communication unit (not shown) such as a Bluetooth communication unit, a wireless fidelity communication unit, a ZIGBEE communication unit, a near field communication unit, etc. The main meter body 100 communicates with a receiving system such as a computer, a Personal Digital Assistant (PDA), a smart mobile phone and the like via the wireless communication unit so as to transmit the measuring results of the clamp meter 10 to the receiving system and/or receive instruction signals and input information from the receiving system.

In the embodiment shown in FIG. 1, the clamp meter 10 includes three clamp probes 200 of different models, whose shapes and structures are different, and these clamp probes are used for measuring current falling in different ranges. It should be understood that, according to the present application, the number of the clamp probes 200 is not limited to the number shown in FIG. 1. According to the needs of the actual application, the number of the clamp probes 200 can be one, two, three, four, five or more.

The clamp probes 200 include a converting unit 240 that converts an electrical signal measured by the clamp probes 200 to an electrical signal within a predetermined range which falls in the measurement range of the main meter body 100 so that the electrical signal within the predetermined range can be accepted and processed by the main meter body 100, whereby the intensity and/or polarity of the current flowing in the current-carrying conductor can be determined. In certain embodiments of the present application, the measuring electrical signal of the clamp probe 200 is a voltage signal, and the converting unit 240 can convert the voltage signal to a range of 0-1V. This converted voltage signal is then transmitted as an output measurement signal to the main meter body 100.

The converting unit 240 can convert a measured electrical signal from a clamp probe to an output measurement signal using any suitable known converting circuit in the art. For example, a converting circuit may include an analog/digital (A/D) converter, a digital modulation circuit, and a digital/analog (D/A) converter. In that case, the A/D converter converts an analog voltage signal $U_0$ measured by the clamp portion 230 to a digital signal; then, the digital modulation circuit modulates the digital signal, for instance, the digital signal is multiplied by a suitable gain coefficient $G_1$ to obtain a modulated digital signal; and at last, the D/A converter converts the modulated digital signal to a voltage signal $U_1$ within the range acceptable to the main meter body 100 (e.g., 0-1V) and outputs the voltage signal as an output measurement signal. In certain embodiments of the present application, the converting circuit may include an analog amplifying circuit having a certain specific gain coefficient $G_2$, wherein the analog voltage signal $U_0$ measured by the clamp portion 230 is converted to a voltage signal $U_1$ within the range acceptable to the main meter body 100 via this analog amplifying circuit, and the signal $U_1$ is output as an output measurement signal.

In order to identify different clamp probes 200, each clamp probe 200 has an identity indicator readable by the main meter body 100. The identity indicators of different clamp probes 200 vary from each other, and one can distinguish different types of the clamp probes through their identity indicators. In certain embodiments, the clamp probe 200 includes a memory 150 readable by the main meter body 100. The memory 150 can be configured as programmable read-only memory (PROM), electrically erasable programmable read-only memory (EEPROM), flash memory and other nonvolatile memory. The identity indicator of each clamp probe 200 can be stored in the memory 150. In certain embodiments, the identity indicator is an electronic file stored in the memory 150, which is readable by the main meter body 100 and contains information about the corresponding clamp probe 200 such as the model, lot number, measurement range, conversion function/diagram of the clamp probe 200. In certain embodiments, the identity indicator is an electronic series number stored in the memory 150, which comprises a set of numbers, one or more digits of which represent the information of the corresponding clamp probe 200 such as the model, lot number, measurement range of the clamp probe 200, etc., respectively. In addition, the memory 150 of a clamp probe 200 can also store other information relevant to the clamp probe such as a specific conversion function/diagram corresponding to the clamp probe 200, etc.

The conversion functions/diagrams of the respective clamp probe 200 can either be determined according to the measuring principle, specific physical parameters of the respective clamp probe, or obtained via experiments. For example, in certain embodiments of the present application, the conversion function/diagram corresponding to a certain clamp probe can be determined by using a clamp probe to measure a current-carrying conductor having a series of standard currents (such as 1 A, 2 A, 3 A, 4 A, 5 A, 10 A, 20 A, 100 A, etc.) flowing through it, and measuring the intensity of the corresponding output measurement signals output by the clamp probe. According to the corresponding relationship between the output measurement signals and the corresponding standard currents, the conversion function of a clamp probe is fitted, or a current-output measurement signal diagram (i.e., a conversion diagram) is made.

As shown in FIG. 1, the clamp probes 200 also include a clamp portion 230 having two clamp arms 231, which can be opened and closed relatively to each other. The clamp portion 230 can measure the current flowing in the current-carrying conductor with a Hall element, a current transformer, a Rogowski coil sensor, or the like. As an example, in an embodiment of the present application, the clamp arm 231 is provided with a core portion made of magnetic materials (such as Ferromagnetic material, high magnetic alloy, etc.) and a coil surrounding the core portion. The clamp arms 231 can be opened to place a current-carrying conductor to be measured between the two clamp arms 231. Then, the clamp arms 231 are closed, with the free ends of the two clamp arms 231 abutting each other to form a closed loop surrounding the current-carrying conductor. When the clamp portion 230 is closed to form a closed loop surrounding the current-carrying conductor to be measured, the current-carrying conductor functions like the primary coil of a transformer, and the coil surrounding the core portion functions like the secondary coil of the transformer. The current flowing in the current-carrying conductor induces magnetic flux in the core portion of the clamp portion 230, thereby generates an induced voltage in the coil of the clamp portion 230. The induced voltage signal is transmitted to the converting unit 240, through which the induced voltage signal is converted to a voltage signal within the range acceptable to the main meter body 100 (such as 0-1V), which is referred to as an output measurement signal.

In an embodiment of the present application, the clamp probe 200 transmits the output measurement signal to the main meter body 100, and the test unit 140 in the main meter body 100 calculates according to the output measurement signal and obtains the current intensity and/or polarity of the current flowing in the current-carrying conductor by using the conversion function/diagram which is read from the memory 150 of the clamp probe 200 connecting to the main meter body 100.

A clamp portion according to an embodiment of the present application is described above as an example. However, the present application is not intended to limit the specific structure of the clamp portion, and the specific shape and structure of the clamp portion can adopt any suitable design commonly used in the art. For example, the present application can use the clamp portion structure described in U.S. Pre-Grant Publication No. 2011/01960 A1 or in U.S. Pre-Grant Publication No. 2012/169324 A1, the disclosures of which are incorporated herein by reference in their entirety.

The clamp probe 200 also includes an adapting connector 220 capable of matching and connecting with the interfacing connector 110 of the main meter body 100 to electrically connect the clamp probe 200 to the interfacing connector 110. The adapting connector 220 is detachable from the interfacing connector 110 of the main meter body 100 so that different clamp probes 200 can be connected to the main meter body 100, respectively, to conduct measurement of different measurement ranges. Furthermore, the clamp probe 200 can also include a cable 210 for electrically connecting the clamp portion 230 and the adapting connector 220. In certain embodiments, the cable 210 can also be omitted, and the clamp portion 230 and the adapting connector 220 can be electrically connected with each other directly.

In the embodiment shown in FIG. 1, the adapting connector 220 is configured as a plug, while the interfacing connector 110 is configured as a socket matching with the adapting connector 220. Those skilled in the art can easily contemplate that other detachable connecting means can be used in the clamp meter of the present application. For example, the adapting connector 220 can be configured as a socket, and the interfacing connector 110 is configured as a plug; or the adapting connector 220 and the interfacing connector 110 are configured as other suitable structures for detachable connection such as screw connection structure, snap joint structure, etc.

In certain embodiments, the converting unit 240 is provided in the adapting connector 220. In certain embodiments, the converting unit 240 is provided in the clamp portion 230. But the position of the converting unit 240 is not limited to those positions, and the converting unit 240 can be placed in other suitable positions on or in the clamp probe 200.

FIG. 2 depicts a block diagram illustrating signal transmitting relationship between the functional units of the clamp meter 10. The working principle of the clamp meter 10 is described below by reference to FIG. 2. When measuring current with the clamp meter 10, a user connects the adapting connector 220 of a clamp probe 200 having a certain measurement range to the interfacing connector 110 of the main meter body 100. Once the clamp probe 200 is connected to the main meter body 100, the test unit 140 of the main meter body 100 can read the identity indicator and other information (such as the conversion function/diagram, etc.) stored in the memory 150 of the clamp probe 200 so that information on the model, measurement range, conversion function/diagram, and other parameters of the clamp probe 200 is obtained. In certain embodiments, the display 120 can display the measurement range of the clamp probe 200 connecting to the main meter body 100. Then, the user opens the clamp arms 231 and places the current-carrying conductor to be measured between the two clamp arms 231 and then closes the clamp arms 231 to surround the current-carrying conductor.

The current flowing through the current-carrying conductor generates an induced voltage on the clamp portion 230, and the converting unit 240 of the clamp probe 200 converts the induced voltage to an output measurement signal in the form of a voltage signal within the range (such as 0-1V) acceptable to the main meter body 100 (i.e., test unit 140), and outputs the output measurement signal to the test unit 140 of the main meter body 100. Based on the converting function/diagram of the clamp probe 200 from the memory 150 of the clamp probe 200 and the output measurement signal from the clamp probe 200, the test unit 140 can determine the intensity and/or polarity of the current flowing through the current-carrying conductor by calculating using the conversion function or looking up the conversion diagram. The information relating to the current intensity and/or polarity of the current can further be transmitted to and displayed on the display 120 of the main meter body 100 for the user to read. In certain embodiments, the information related to the current intensity and/or polarity of current can also be transmitted through a wireless communication unit in the clamp meter 10 to a receiving system such as a smart mobile terminal.

Figure 3:
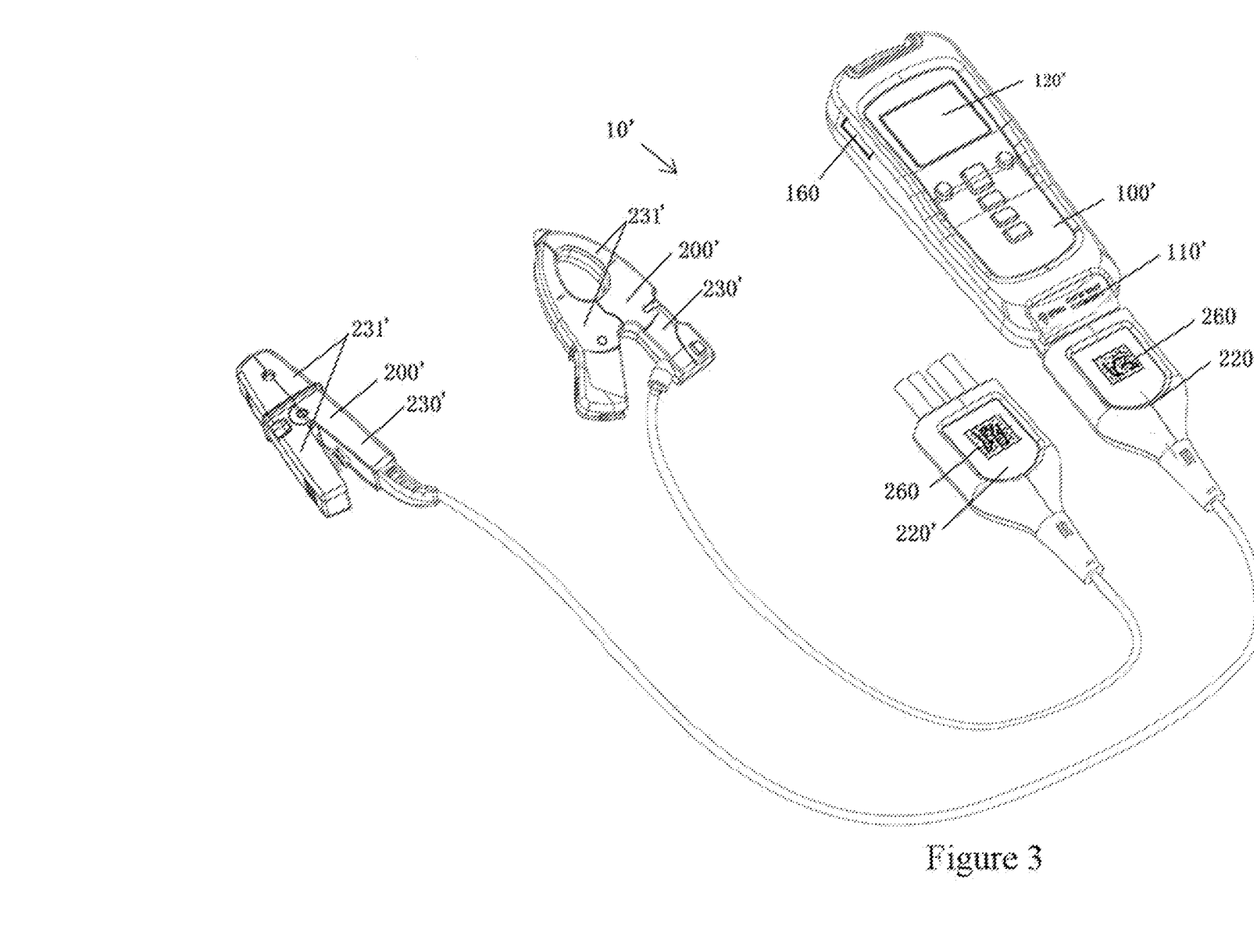
FIG. 3 depicts a structure diagram of a clamp meter according to another embodiment of the present application.

A clamp meter 10' according to another embodiment of the present application will be described below by reference to FIGS. 3 and 4. The structure of the clamp meter 10' shown in FIG. 3 is substantially identical to the clamp meter 10 shown in FIG. 1. Therefore, the following description will focus on the components of clamp meter 10' that are different from those of the clamp meter 10. As to features of the components not described in detail, one can refer to the above description of components of the clamp meter 10.

As shown in FIG. 3, the clamp meter 10' includes a main meter body 100' and a plurality of clamp probes 200'. The main meter body 100' has a interfacing connector 110', wherein each clamp probe 200' can be detachably connected to the interfacing connector 110' of the main meter body 100'.

The clamp probe 200' includes a converting unit 240' for converting the electronic signal measured by the clamp probe to an output measurement signal within the acceptable predetermined range (such as 0-1V) of the main meter body 100'. The converting unit 240' can have a structure identical or similar to that of the converting unit 240.

The clamp probe 200' also includes a clamp portion 230' for measuring the current flowing through a current-carrying conductor. The clamp portion 230' can be a clamp portion of any suitable type in the art, and one can refer to the above description with reference to FIG. 1 for more details. The clamp probe 200' also includes an adapting connector 220' capable of matching or connecting with the interfacing connector 110' of the main meter body 100', achieving a detachably electrical connection between the clamp probe 200' and the interfacing connector 110'.

The clamp probe 200' is provided with an identity indicator readable by the main meter body 100'. The identity indicators of the clamp probes 200' are different from each other so that various types of clamp probes can be distinguished by the identity indicators. As shown in FIG. 3, the identity indicator is configured as an identification tag 260 having a specific visible bar code, and the identification tag 260 is provided on the external surface of the adapting connector 220' of the clamp probe 200'. In the present application, the visible bar code on the identification tag 260 can be a two-dimensional bar code formed by black and white alternating patterns distributed on a plane according to a certain rule, or a colorful bar code consisting of strips or patterns of various colors, or other black and white or colorful patterns capable of representing specific information. In certain embodiments, the identification tag 260 of a clamp probe 200' can be configured as a radio frequency identification tag. In other embodiments, the identification tag 260 of a clamp probe 200' can be configured as a near field communication identification tag. The identification tag 260 can be loaded with information of the corresponding clamp probe 200', including but not limited to, the model, lot number, measurement range, conversion function/diagram of the clamp probe 200'. The conversion function/diagram can be obtained by calculation according to conventional methods known in the art or by experiments (such as the experimental methods mentioned above).

Optionally, the identification tag 260 can also be provided on the clamp portion 230' of a clamp probe 200' or at other suitable portions of the clamp probe 200'.

A tag reader 160 for reading the identification tag 260 is provided on the main meter body 100' so as to read the information loaded on the corresponding identification tag 260, which is related to the clamp probe 200'. When the identification tag 260 is an identification tag having a specific visible bar code, the tag reader 160 can be configured as, for example, a camera, a barcode scanner and other optical reading devices. When the identification tag 260 is a radio frequency identification tag or a near field communication tag, the tag reader 160 is correspondingly configured as a radio frequency identification tag reader or a near field communication tag reader. In the embodiment shown in FIG. 3, the tag reader 160 is provided on one side of the main meter body 100'. Optionally, the tag reader 160 can also be provided at the bottom, top or other suitable portions of the main meter body 100'.

Figure 4:
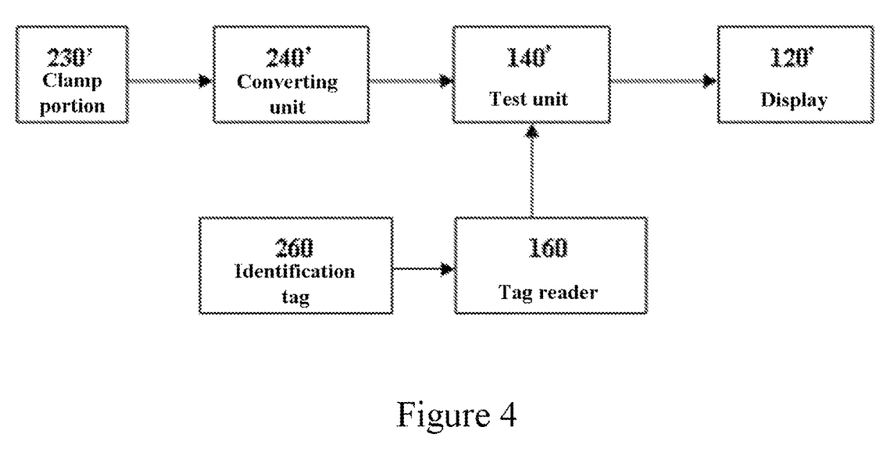
FIG. 4 depicts a block diagram indicating the signal transmitting relationship between the functional units of the clamp meter shown in FIG. 3.

FIG. 4 depicts a block diagram illustrating the signal transmitting relationship between the functional units of the clamp meter 10'. The working principle of the clamp meter 10' will be described by reference to FIG. 4. When conducting measurement with the clamp meter 10', a user first needs to select a suitable clamp probe 200', then obtains the information relating to the clamp probe 200' (such as the model, measurement range, conversion function/diagram of the clamp probe) by using the tag reader 160 to read the identification tag 260 of the selected clamp probe 200' and transmits the information to the test unit 140'. Then, the adapting connector 220' of the clamp probe 200' is connected to the interfacing connector 110' of the main meter body 100'. Next, the current-carrying conductor is placed between the two clamp arms 231' of the clamp portion 230', and then the clamp arms 231' are closed to surround the current-carrying conductor.

The current flowing through the current-carrying conductor generates an induced voltage on the clamp portion 230'. The converting unit 240' of the clamp probe 200' converts the induced voltage to an output measurement signal within the measurement range of the main meter body 100', for example, a voltage signal within 0-1V, and outputs the output measurement signal to the test unit 140' of the main meter body 100'. Based on the information of the clamp probe 200' read by the tag reader 160' and the output measurement signal, the test unit 140' can determine the intensity and/or polarity of the current flowing through the current-carrying conductor. The information on the current intensity and/or polarity can be transmitted to the display 120' of the main meter body 100' for display to the user.

Although various aspects and embodiments of the present application are disclosed herein, other aspects and embodiments of the present application are obvious to those skilled in the art. The various aspects and embodiments disclosed herein are merely intended for illustrative purposes but not limitation. The protection scope and spirit of the present application shall be defined by the appended claims.

The invention claimed is:

1. A clamp meter comprising:
    a main meter body having an interfacing connector; and
    a plurality of clamp probes, wherein each of the clamp probes is separately detachably connectable to the interfacing connector of the main meter body,
    wherein each of the clamp probes has a converting unit that converts a signal measured by the clamp probe to an output measurement signal within a predetermined measurement range of the main meter body, wherein of the clamp probes has an identity indicator readable by the main meter body, and wherein the clamp probes have different measurements ranges for measuring different current ranges.

2. The clamp meter of claim 1, wherein each of the clamp probes has a memory readable by the main meter body.

3. The clamp meter of claim 2, wherein the memory of each clamp probe stores the identity indicator of said clamp probe.

4. The clamp meter of claim 2, wherein the memory of each clamp probe stores a conversion function or diagram of said clamp probe.

5. The clamp meter of claim 1, wherein the identity indicator is in the form of a series number, a tag having a specific bar code thereon, a radio frequency identification tag, or a near field communication tag.

6. The clamp meter of claim 1, wherein the main meter body further comprises a wireless communication unit for transmitting measurement data according to the output measurement signal to a receiving system.

7. The clamp meter of claim 1, wherein the main meter body supplies power to a clamp probe connected to the main meter body.

8. The clamp meter of claim 1, wherein each clamp probe has a clamp and an adapting connector.

9. The clamp meter of claim 8, wherein each clamp probe further comprises a cable electrically connecting the clamp and the adapting connector.

10. The clamp meter of claim 8, wherein the adapting connector is capable of electrically connecting to the interfacing connector of the main meter body.

11. The clamp meter of claim 8, wherein one of the adapting connector and the interfacing connector is configured as a socket, and the other is configured as a plug.

12. The clamp meter of claim 8, wherein the converting unit of the clamp probe is placed in the adapting connector.

13. The clamp meter of claim 1, wherein the identity indicator of each clamp probe contains information regarding a conversion function or diagram of said clamp probe.

14. The clamp meter of claim 1, wherein the identity indicator of each clamp probe contains information regarding the measurement range of said clamp probe.

15. The clamp meter of claim 14, wherein the main meter body is configured to display the measurement range of a clamp probe connected to the main meter body.

16. The clamp meter of claim 1, wherein the main meter body carries a battery.

17. A clamp meter comprising:
a main meter body having an interfacing connector,
a plurality of clamp probes, wherein:
  each clamp probe is separately detachably connectable to the interfacing connector of the main meter body,
  each clamp probe has a converting unit that converts a signal measured by the clamp probe to an output measurement signal within a predetermined measurement range of the main meter body, and
  each clamp probes has an identity indicator indicating information of said clamp probe,
and wherein:
  the identity indicator of each clamp probe contains information regarding a measurement range of said clamp probe, and
  the main meter body is configured to display the measurement range of a clamp probe connected to the main meter body.

18. The clamp meter of claim 17, wherein each clamp probe further comprises a readable memory.

19. The clamp meter of claim 18, wherein the memory stores the identity indicator of said clamp probe.

20. The clamp meter of claim 18, wherein the memory stores a conversion function or diagram of said clamp probe.

21. The clamp meter of claim 17, wherein the identity indicator is in the form of a series number, a tag having a specific bar code thereon, a radio frequency identification tag, or a near field communication tag.

22. The clamp meter of claim 17, wherein each clamp probe has a clamp and an adapting connector.

23. The clamp meter of claim 22, wherein the clamp probe further comprises a cable electrically connecting the clamp and the adapting connector.

24. The clamp meter of claim 22, wherein the adapting connector is configured as a socket or a plug.

25. The clamp meter of claim 22, wherein the converting unit is placed in the adapting connector.

26. The clamp meter of claim 17, wherein the identity indicator contains information regarding a conversion function or diagram of said clamp probe.

27. The clamp meter of claim 17, wherein the identity indicator contains information regarding the measurement range of said clamp probe.

28. The clamp meter of claim 17, wherein the clamp probe is connectable to a current meter configured to receive and process the output measurement signal from the clamp probe.

* * * * *

UNITED STATES PATENT AND TRADEMARK OFFICE
CERTIFICATE OF CORRECTION

Page 1 of 1

PATENT NO. : 9,739,800 B2
APPLICATION NO. : 14/861902
DATED : August 22, 2017
INVENTOR(S) : Shounan Luo

It is certified that error appears in the above-identified patent and that said Letters Patent is hereby corrected as shown below:

In the Claims

Column 8, Line 67:
"wherein of" should read, --wherein each of--.

Column 10, Line 10:
"each clamp probes" should read, --each clamp probe--.

Signed and Sealed this
Thirty-first Day of December, 2019

Andrei Iancu
*Director of the United States Patent and Trademark Office*